(12) United States Patent
Nygren et al.

(10) Patent No.: US 7,844,888 B2
(45) Date of Patent: Nov. 30, 2010

(54) ELECTRONIC DEVICE, METHOD FOR OPERATING AN ELECTRONIC DEVICE, MEMORY CIRCUIT AND METHOD OF OPERATING A MEMORY CIRCUIT

(75) Inventors: Aaron John Nygren, Munich (DE); Thomas Hein, Munich (DE)

(73) Assignee: Qimonda AG, Munich (DE)

( * ) Notice: Subject to any disclaimer, the term of this patent is extended or adjusted under 35 U.S.C. 154(b) by 1075 days.

(21) Appl. No.: 11/537,401

(22) Filed: Sep. 29, 2006

(65) Prior Publication Data

US 2008/0082898 A1    Apr. 3, 2008

(51) Int. Cl.
*G11C 29/00* (2006.01)
(52) U.S. Cl. ....................................... 714/805
(58) Field of Classification Search ................... 714/805
See application file for complete search history.

(56) References Cited

U.S. PATENT DOCUMENTS

| | | | | |
|---|---|---|---|---|
| 3,573,728 A | * | 4/1971 | Kolankowsky et al. ...... | 714/764 |
| 3,814,922 A | * | 6/1974 | Nibby et al. ................. | 714/723 |
| 6,014,720 A | * | 1/2000 | Wang et al. .................. | 710/307 |
| 6,718,444 B1 | * | 4/2004 | Hughes ....................... | 711/155 |
| 7,275,200 B2 | * | 9/2007 | Leung ......................... | 714/763 |
| 7,392,456 B2 | * | 6/2008 | Leung et al. ................. | 714/763 |
| 7,458,004 B2 | * | 11/2008 | Takahashi ................... | 714/763 |
| 7,464,241 B2 | * | 12/2008 | Vogt ........................... | 711/168 |

FOREIGN PATENT DOCUMENTS

JP    07-093225    4/1995

* cited by examiner

*Primary Examiner*—Stephen M Baker
(74) *Attorney, Agent, or Firm*—Patterson & Sheridan, LLP

(57) ABSTRACT

The present invention relates to a method of operating an electronic device and an electronic device. The electronic device comprises a signal path for transmitting data, an input/output interface connected with the signal path, a masking circuit and an error calculation circuit. The masking circuit is connected with the signal path and the error calculation circuit. The error calculation circuit is connected with the signal path. The signal path is connected with the masking circuit to deliver masking information to the masking circuit. The masking circuit considers the received masking information for masking the data and delivers the masked and non-masked data to the error detection circuit.

23 Claims, 2 Drawing Sheets

| MA<8:0> during WREM | DQ Masked during WREM | |
|---|---|---|
| CKr/r# | CKr | CKr# |
| MA7 | DQ31,DQ23,DQ15,DQ7 | DBI3,DBI2,DBI1,DBI0 |
| MA6 | DQ30,DQ22,DQ14,DQ6 | x |
| MA5 | DQ29,DQ21,DQ13,DQ5 | x |
| MA4 | DQ28,DQ20,DQ12,DQ4 | x |
| MA3 | DQ27,DQ19,DQ11,DQ3 | x |
| MA2 | DQ26,DQ18,DQ10,DQ2 | x |
| MA1 | DQ25,DQ17,DQ9,DQ1 | x |
| MA0 | DQ24,DQ16,DQ8,DQ0 | x |

ELECTRONIC DEVICE, METHOD FOR OPERATING AN ELECTRONIC DEVICE, MEMORY CIRCUIT AND METHOD OF OPERATING A MEMORY CIRCUIT

BACKGROUND OF THE INVENTION

1. Field of the Invention

The present invention refers to an electronic device, a memory circuit, to a DRAM memory, a graphic DRAM and a method of operating a memory circuit.

2. Description of the Related Art

Electronic devices such as memory circuits, especially dynamic random access memory (DRAM) circuits, use an error detecting calculation for detecting errors during operation of the memory circuit.

The detection works conventionally by calculating a cyclic redundancy checks (CRC) checksum over a certain number of data lines and over all bits of one data burst. The checksum may be returned to a memory controller that can decide, whether the transmission of the data was error-free or not. In case of error, the memory controller may decide to repeat the transmission or even to redo the training.

SUMMARY OF THE INVENTION

One embodiment of the invention refers to an electronic device with an improved error-detection calculation. The electronic device comprises an error-detecting calculation, wherein at least a part of the data that is provided for performing the error-detecting calculation are masked, and wherein information for masking the data is provided by a signal path.

Another embodiment of the invention refers to a memory circuit with an improved error-detection calculation. The memory circuit comprises an error-detecting calculation, wherein at least a part of the data that is provided for performing the error-detecting calculation are masked, and wherein information for masking the data is provided by an address bus of the memory circuit.

Another embodiment of the invention refers to a memory circuit with a read/write circuit and memory elements. The read/write circuit is connected with a signal path receiving address data for accessing memory elements. An input/output interface is disposed in connection with the signal path. The signal path is configured for transmitting data, commands and addresses. A masking circuit and an error calculation circuit are arranged. The masking circuit is connected with the signal path and the error calculation circuit. The error calculation circuit is connected with the signal path. The signal path is connected with the masking circuit delivering masking information to the masking circuit. The masking circuit considers the received masking information for masking the data and delivers the masked and non-masked data to the error detection circuit.

Another embodiment of the invention refers to a memory circuit with a memory array with a read/write circuit and memory elements. The read/write circuit is connected with an address bus receiving address data for accessing memory elements. An input/output interface is connected with a data bus, a command bus and the address bus. The data bus is configured for sending data. The command bus is configured for sending commands. The address bus is configured for sending addresses to the memory array. Furthermore, a masking circuit and an error calculation circuit are arranged. The masking circuit is connected with the data bus and the error calculation circuit. The error calculation circuit is connected with the input/output interface. The address bus is connected with the masking circuit delivering masking information to the masking circuit. The masking circuit considers the received masking information for masking the data and delivers the masked and non-masked data to the error detection circuit.

A further embodiment of the invention refers to a DRAM memory comprising a memory array having a read/write circuit and memory elements. The read/write circuit is connected with an address bus receiving address data for accessing memory elements. An input/output interface is connected with a data bus, a command bus and the address bus. The data bus is configured for sending data. The command bus is configured for sending commands. The address bus is configured for sending addresses to the memory array. Furthermore, a masking circuit and an error calculation circuit are arranged. The masking circuit is connected with the data bus and the error calculation circuit. The error calculation circuit is connected with the input/output interface. The address bus is connected with the masking circuit delivering masking information to the masking circuit. The masking circuit considers the received masking information for masking the data and delivers the masked and non-masked data to the error detection circuit.

Another embodiment of the invention refers to a graphic DRAM memory with a memory array with a read/write circuit and memory elements. The read/write circuit is connected with an address bus receiving address data for accessing memory elements. An input/output interface is connected with a data bus, a command bus and the address bus. The input/output interface is connected with the data bus, the command bus and the address bus. The data bus is configured for sending data. The command bus is configured for sending commands. The address bus is configured for sending addresses to the memory array. Furthermore, a masking circuit and an error calculation circuit are arranged. The masking circuit is connected with the data bus and the error calculation circuit. The error calculation circuit is connected with the input/output interface. The address bus is connected with the masking circuit delivering masking information to the masking circuit. The masking circuit considers the received masking information for masking the data and delivers the masked and non-masked data to the error detection circuit.

Another embodiment of the invention refers to a method of operating a memory circuit, wherein masking information is provided on a signal path of the memory circuit, wherein data are provided on the signal path of the memory circuit, wherein at least a part of the data are masked utilizing the masking information, wherein the masked data and non-masked are used for performing an error detection calculation, and wherein a result of the error detection calculation is outputted.

A further embodiment of the invention refers to a method of operating a memory circuit, wherein a masking information is provided on an address bus of the memory circuit, wherein data are provided on a data bus of the memory circuit, wherein the masking information is also delivered to a read/write circuit of the memory circuit, wherein a deactivation signal is delivered to the read/write circuit deactivating the read/write circuit for the received masking information, wherein a masking command signal is received activating the masking and deactivating reading data or writing data from the memory array, wherein at least a part of the data are masked utilizing the masking information, wherein the masked data and non-masked data are used for performing an error detection calculation, and wherein a result of the error detection calculation is outputted.

A further embodiment refers to a system comprising a memory controller, a signal path and a memory circuit. The memory controller is connected via the signal path with the memory circuit. The memory circuit comprises a read/write circuit and memory elements. The read/write circuit is connected with the signal path receiving address data for accessing memory elements. A masking circuit and an error calculation circuit are provided. The masking circuit is connected with the signal path and the error calculation circuit. The error calculation circuit is connected with the signal path. The signal path is connected with the masking circuit delivering masking information to the masking circuit. The masking circuit considers the received masking information for masking the data and delivers the masked and non-masked data to the error detection circuit. The error detection circuit generates an error result and delivers the error result via the signal path to the memory controller. The signal path is disposed for exchanging data, for sending commands and for sending addresses from the memory controller to the memory circuit.

Another embodiment of the invention refers to an electronic device having a signal path and an input/output interface connected with the signal path. The signal path is disposed for transmitting data. A masking circuit and an error calculation circuit are provided. The masking circuit is connected with the signal path and the error calculation circuit. The error calculation circuit is connected with the signal path. The signal path is connected with the masking circuit delivering masking information to the masking circuit. The masking circuit considers the received masking information for masking the data and delivers the masked and non-masked data to the error detection circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally relates to electronic devices with an error calculation such as a memory circuit. More particularly, the invention relates to a dynamic random access memory, a graphic dynamic random access memory and/or a flash memory.

The present invention may be described in terms of various functional components. It should be appreciated that such functional components may be realized by any number of hardware or structural components configured to perform the specified functions. For example, the present invention may employ various integrated components comprised of various electronic devices, such as resistors, transistors, capacitors, diodes and such components, the behaviour of which may be suitably configured for various intended purposes. In addition, the present invention may be practised in any integrated circuit application where an effective reversible polarity is desired. Such general applications may be appreciated by those skilled in the art in light of the present disclosure are not described in detail. Further, it should be noted that various components may be suitably coupled or connected to other components within exemplary circuits, and that such connections and couplings can be realized by direct connection between components and by connections through other components and devices located in between.

In the following, the invention is explained using as an example a memory circuit. However, the invention is not limited to memory circuits and may be used in any electronic device involving data transmission, such as mobile phones, data processing circuits, and computer systems that use an error calculation and a masking of data that are used for the error calculation.

Figure 1:
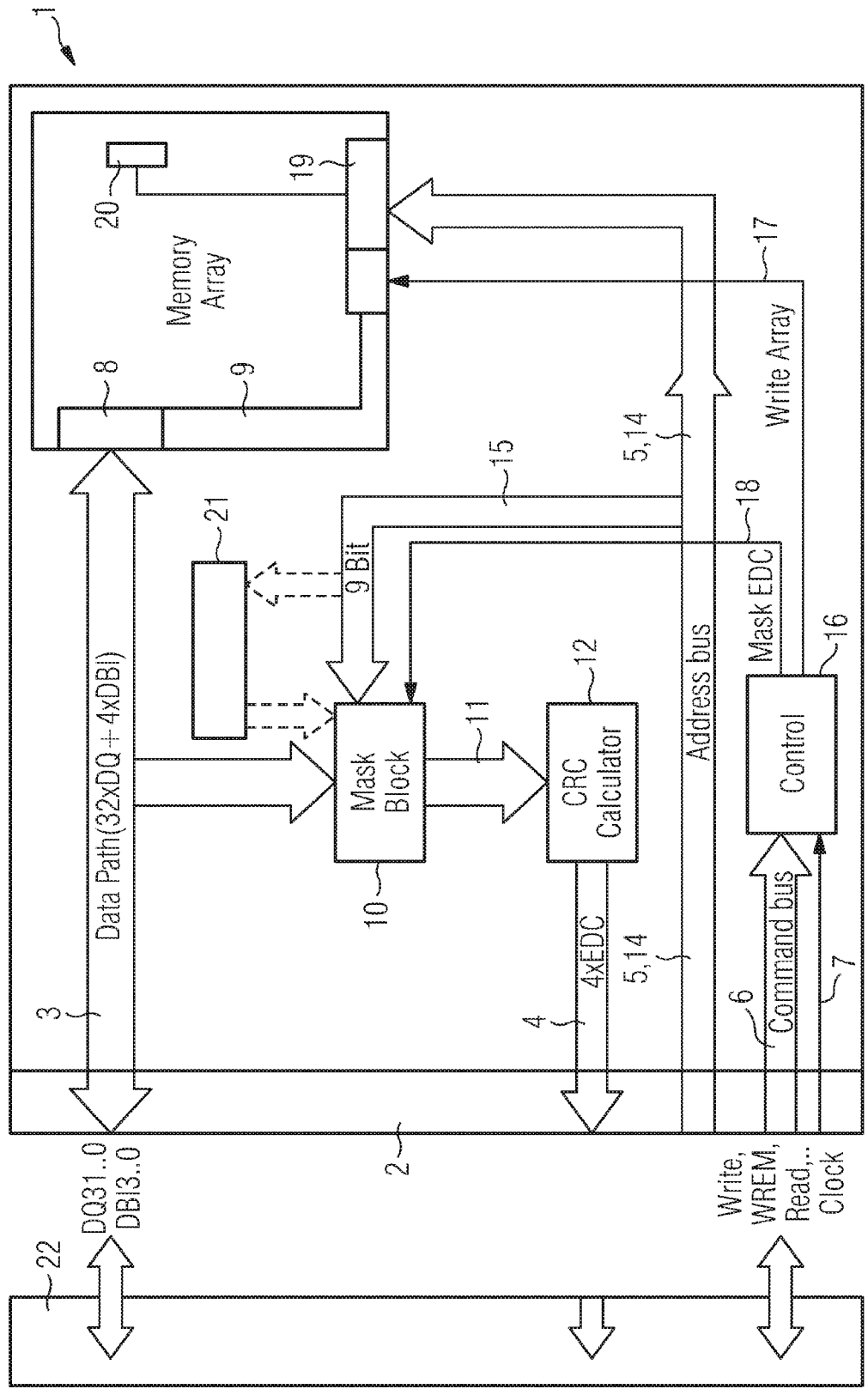
FIG. 1 is a schematic diagram illustrating one embodiment of a memory circuit and a memory controller.

FIG. 1 depicts in a schematic view a memory circuit 1 with an interface 2 that is in connection with a memory controller 22. The interface 2 is connected with a data path 3, an error path 4, an address bus 5, a command bus 6 and a clock line 7. The data path 3 is connected with a data in/output 8 of a memory array 9. Furthermore, the data path 3 is connected with a masking circuit 10. A masking circuit 10 is connected by a masking path 11 with an error calculating circuit 12. The error calculating circuit 12 is connected with the error path 4. The address bus 5 is connected with a read/write circuit 19 of the memory array 9. Furthermore, the address bus 5 is connected with the masking circuit 10. As illustrated in FIG. 1, Data Path 3 includes 32 bits for data and 4 bits for data bus inversion (DBI) bits. The term "DBI" is well known in the art and typically used for inverting data bits for power saving purposes. Since the term "DBI" is well known in the art, further details are being omitted to avoid obscuring the present invention.

In an embodiment of the memory circuit 1, a main address bus 14 connects the interface 2 with the read/write circuit 19. With the main address bus 14 a masking address bus 15 is connected that is guided to the masking circuit 10. The masking address bus 15 may have a smaller data width, i.e., less parallel signal lines, compared to the main address bus 14. In a further embodiment, the main address bus may be connected with the masking circuit 10 and with the read/write circuit 19.

The command bus 6 and the clock line 7 are connected with a control circuit 16. The control circuit 16 is connected by a first control line 17 with a memory array 9 and by a second control line 18 with a masking circuit 10.

The read/write circuit 19 is connected with the in/output 8 and with the main address bus 14. The read/write circuit 19 is connected with memory elements 20 of the memory array 9. In the memory array 9 a plurality of memory elements 20 are disposed, wherein for a simplification of the drawing, only one memory element 20 is depicted. Each of the memory elements 20 may be accessible individually by using address data that is supplied over the address bus 5 to the read/write circuit 19.

The read/write circuit 19 may comprise a column-decoder and a row-decoder for accessing columns and rows of memory elements. Furthermore, the read/write circuit 19 may comprise amplifiers for reading and/or for writing data from or to the memory elements.

The reading and writing of data from or to memory elements is performed by supplying the addresses of the memory elements via the address bus 5 to the read/write circuit 19. Additionally, the control circuit 16 supplies a read or write command via the first control line 17 to the read/write circuit 19. After receiving the addresses of the memory elements, the read/write circuit 19 accesses the memory elements that are determined by the addresses and perform a read or a write operation according to the command that is received from the control circuit 16. The control circuit 16 receives operating commands via the command bus 6 from the memory controller 22. The operating commands may be a write command to write data that are supplied to the data path 3 via the interface 2 in memory elements of the memory array. A read operating command starts a reading operation in which data are read from determined memory elements and the read data are output via the data path 3 and the interface 2. The memory elements are determined by addresses that are supplied via the address bus 5 to the read/write circuit 19.

Additionally, a write operation with ECD mask (WREM) command may be supplied via the command bus 6 to the control circuit 16. This command starts an error calculation operation, wherein data are supplied via the interface 2 and the data path 3 to the masking circuit 10. Additionally, a masking information is supplied via the interface 2, the address bus 5 and the masking address bus 15 to the masking circuit 10. The masking information may be supplied from the memory controller. The masking circuit 10 furthermore receives a masking signal from the control circuit 16 via the second control line 18. The control circuit 16 additionally sends a write stop signal via the first control line 17 to the read/write circuit 19 after receiving a WREM command via the command bus 6.

The read/write circuit 19 receives the write stop signal and does not write the data that is applied via the data path 3 to memory elements 20. This may be necessary, because the data path 3 may supply test data that are used for the error calculation also to the in/output 8 of the memory array 9. Depending on the embodiment, it might not be necessary to dispose the first control line 17 and to use a write stop signal. In this embodiment, payload data that are supplied via the data path 3 to the memory array 9 and written in memory elements 20 are additionally used to perform an error calculation.

The masking circuit 10 masks the data supplied by the data path 3 utilizing the masking information supplied by the masking address bus 15 and delivers the masked data and the non-masked data via the masking path 11 to the error calculating circuit 12.

The masking information may determine individual data bits of the received data for masking. Furthermore, the masking information may provide masking pattern information that determines which data of a data burst are to be masked. In a further embodiment, the masking information comprises the information indicating which data for a data path have to be masked. In one embodiment, the masking information may comprise the position of the data bits within a data burst. For example, the masking information may indicate that the first seven data bits of an eight data bit group of a data burst are masked and the last data bit is not masked. This information may be supplied for each data channel, if the data of the data path 3 are supplied via parallel data channels to the masking circuit 10. The data path 3, the address bus 5,14 and the masking address bus 15, the error path 4 with the interface 2 may be constructed as at least one signal path, for example, as a bus or one or more signal lines.

Figures 2, 3:
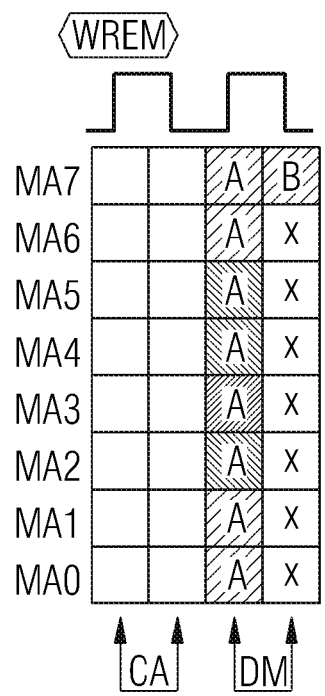
FIG. 2 depicts a masking information.
FIG. 3 depicts one embodiment of a mapping of the masking information to data.

FIG. 2 depicts a schematic diagram of a WREM command that is delivered to the control circuit 16 and a table depicts a masking pattern information that is supplied via the address bus 5 and the masking address bus 15 to the masking circuit 10. The masking information is supplied in a group of eight data bits. FIG. 2 depicts two groups of data bits that are supplied to the masking circuit 10. The first group is supplied with an uprising edge of the WREM command and comprises eight data bits, whereby the eight data bits may have a value 0 or a value 1. In the Figure, the values of the data bits are depicted with A. If a data bit of the masking information comprises the value 0, it means that this data will not be masked. In that case, the data bit will be fed as it is into the error calculation circuit 12. If the data bit of the masking information comprises the value 1, it means that the date bit will be masked. The corresponding data bit is replaced by a value 1 bit and fed into the error calculating circuit 12.

FIG. 3 depicts the mapping of the masking information to the data bits DQs that are supplied via the data path 3.

In a further embodiment, a storing circuit 21 is connected with the masking circuit 10 and the masking address bus 15. The storing circuit 21 comprises masking information, for example, a data pattern, that determines the data received via the data path 3 by the masking circuit 10 that are to be masked. In this embodiment, the masking address bus 15 is connected with the storing circuit 21. The masking circuit 10 looks up in the storing circuit 21 to select the data that are to be mask. Via the address bus 5 and the masking address bus 15, the masking information, for example the masking data pattern, of the storing circuit 21 may be changed. In this embodiment, it is not necessary to supply during a masking operation of the masking circuit 10 in time the masking information via the address bus 5 and the masking address bus 15. In this embodiment, only changes of a data masking pattern are supplied via the masking address bus 15 to the storing circuit 21. The masking circuit 10 takes the masking information from the storing circuit 21. The storing circuit 21 may also be part of the masking circuit 10.

The error calculating circuit 12 checks the operation of the memory circuit 1 and then delivers a result data of the error detection over the error path 4 and interface 2 to the memory controller. The error calculating circuit 12 may, for example, use cyclic redundancy checks (CRC) that are frequently carried out in order to detect errors that can occur during the data transmission from the memory controller to the memory circuit. In this case, data are transmitted in data blocks, and a redundant code is produced from the data in each block and is added to the block for error detection or correction. In one embodiment, the so called CRC code (cyclic redundancy check code) is derived from the payload data that is received via the data path 3, in a block as a cyclic redundant code, using a predetermined algorithm. The CRC codes are produced by multiplication of a payload data signal sequence by a so called generator polynomial. After the generation of the code word, it is divided by the generator polynomial. If the received code word has been transmitted correctly, then the division process does not produce any reminder. Conversely, if the division process results in a reminder, this confirms that the data transmission was not correct. Cyclic codes which address their CRC code are primarily of major interest because the multiplication and division of polynomials can be carried out easily by means of so called linear feedback shift registers. However, depending on the embodiment, also other errors detection calculation methods may be used. The error calculating circuit 12, using a CRC calculation generates a checksum over a certain number of data lines and over all bits of one data burst. The checksum is returned to the memory controller that can then decide whether the transmission of the data was error-free. In case of an error, the memory controller can decide to repeat transmission or even to redo the training.

The masking of the data has the advantage that at least part of the data are present with correct values, which is of advantage for the error calculating circuit 12. Furthermore, individual data bits of the data can be detected as false data, using the masking method. The error result data of the error calculating circuit 12 may be supplied via the interface 2 to a memory controller 22. The memory controller 22 may receive the error result data and use the error result data for adjusting a time phase of the data signal with which the data are transferred from the memory controller 22 to the interface 2 and the data path 3 of the memory circuit 1.

An aspect of the present invention provides a write phase training without accessing the memory elements 20. The idea is to use information returned by the error calculation circuit from the memory circuit to the memory controller to align a time position of a data signal for transmitting data from the memory controller to the memory circuit relative to a time basis of the memory circuit that is used for detecting the value of data bits of the data signal in the interface 2. The memory circuit samples the data bits that are received by the interface 2 according to the internal time clock. Therefore, it is necessary that the data signal is transmitted in a predetermined time phase related to the internal time clock of the memory circuit.

The error result delivered from the memory circuit to the memory controller may contain enough information to allow a phase relationship estimation between the data clock of the memory controller and the sampling clock of the memory circuit. So it is no longer necessary to do write operations to the memory elements of the memory circuit, but instead it is sufficient to monitor the information returned by the error calculation circuit of the memory circuit when doing dummy writes. The dummy writes may be further performed, using a mask signal to mask all bits for a writing operation or by explicitly using dummy write commands, which would need to be implemented in the memory circuit.

The memory circuit may for example be constructed as a dynamic random access memory. Also, other types of memory circuits may implement embodiments of the invention. Especially, a graphic dynamic random access memory may be utilized for implementing the invention.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
   a plurality of memory elements;
   a signal path for transmitting data, commands and addresses;
   a read/write circuit connected with the signal path to receive address data for accessing the plurality of memory elements;
   an input/output interface connected with the signal path;
   a masking circuit; and
   an error detection circuit, wherein the masking circuit is connected with the signal path and the error detection circuit, wherein the error detection circuit is connected with the signal path, wherein the signal path is connected to deliver masking information to the masking circuit, and wherein the masking circuit utilizes the received masking information for masking the data and delivers the masked and non-masked data to the error detection circuit.

2. A memory circuit, comprising:
   a memory array having a read/write circuit and a plurality of memory elements, wherein the read/write circuit is connected with an address bus to receive address data for accessing memory elements;
   an input/output interface connected with a data bus for sending data, a command bus for sending commands and the address bus, wherein the address bus is configured for sending addresses to the memory array;
   a masking circuit; and
   an error detection circuit, wherein the masking circuit is connected with the data bus and the error detection circuit, wherein the error detection circuit is connected with the input/output interface, wherein the address bus is connected with the masking circuit to deliver masking information to the masking circuit, and wherein the masking circuit utilizes the received masking information for masking the data and delivers the masked and non-masked data to the error detection circuit.

3. The memory circuit of claim 2, wherein the address bus comprises a predetermined number of data lines, wherein only a portion of the data lines is connected with the masking circuit and wherein all data lines of the address bus are connected with an address decoder.

4. The memory circuit of claim 2, further comprising:
   a storing circuit connected with the address bus and with the masking circuit.

5. The memory circuit of claim 2, further comprising:
   a control command circuit connected with the command bus, wherein the control command circuit is connected via a control line with the masking circuit, the control line being utilized by the command circuit for sending a masking signal.

6. The memory circuit of claim 5, wherein the control command circuit is connected via a second control line with the read/write circuit, and wherein the second control line is utilized for deactivating the read/write circuit such that address data that are delivered by the address bus to the read/write circuit are not used for reading or writing data to memory elements.

7. A dynamic random access memory (DRAM) circuit, comprising:
   a) a memory array having a read/write circuit and a plurality of memory elements, wherein the read/write circuit is connected with a first address bus to receive address data for accessing memory elements;
   b) an input/output interface input/output interface connected with a data bus for sending data, a command bus for sending commands and the address bus for sending addresses to the memory array; and
   c) a masking circuit and an error detection circuit, wherein the masking circuit is connected with the data bus and the error detection circuit, wherein the error detection circuit is connected with the input/output interface, wherein the address bus is connected with the masking circuit to deliver masking information to the masking circuit, and wherein the masking circuit utilizes the received masking information for masking the data and delivers the masked and non-masked data to the error detection circuit.

8. The DRAM circuit of claim 7, wherein the address bus comprises a predetermined number of data lines, wherein only a portion of the data lines is connected with the masking circuit, and wherein all data lines of the address bus are connected with the read/write circuit.

9. The DRAM circuit of claim 7, further comprising:
   a storing circuit connected with the address bus and with the masking circuit.

10. The DRAM circuit of claim 7, further comprising:
    a control command circuit connected with the command bus, wherein the control command circuit is connected via a control line with the masking circuit, the control line being utilized by the command circuit for activating the masking circuit.

11. The DRAM circuit of claim 10, wherein the control command circuit is connected via a second control line with the read/write circuit, the second control line being utilized for deactivating the read/write circuit, to not use address data that are delivered by the address bus to the address decoder.

12. A graphic dynamic random access memory (DRAM) circuit, comprising:
    a) a memory array having a read/write circuit and a plurality of memory elements, wherein the read/write circuit is connected with an address bus to receive address data for accessing memory elements;
    b) an input/output interface input/output interface connected with a data bus for sending data, a command bus for sending commands and the address bus for sending addresses to the memory array; and c) a masking circuit and an error detection circuit, wherein the masking circuit is connected with the data bus and the error detection circuit, wherein the error detection circuit is connected with the input/output interface, wherein the address bus is connected with the masking circuit to deliver masking information to the masking circuit, and wherein the masking circuit utilizes the received masking information for masking the data and delivers the masked and non-masked data to the error detection circuit.

13. The graphic DRAM circuit of claim 12, further comprising:
a control command circuit connected with the command bus, wherein the control command circuit is connected via a control line with the masking circuit, the control line being utilized by the command circuit for activating the masking circuit.

14. The graphic DRAM memory of claim 12, wherein the control command circuit is connected via a second control line with the read/write circuit, the second control line being utilized for deactivating the read/write circuit, to not use address data that are delivered by the address bus to read or write data.

15. The graphic DRAM circuit of claim 12, wherein the address bus comprises a predetermined number of data lines, wherein only a portion of the data lines is connected with the masking circuit, and wherein all data lines of the address bus are connected with the read/write circuit.

16. A method of operating a memory circuit, comprising:
providing masking information on a signal path of the memory circuit, wherein the masking information includes one or more bits to mask a data that is provided for error detection calculation;
providing data on the signal path of the memory circuit;
masking at least a part of the data utilizing the masking information;
performing an error detection calculation utilizing the masked data and non-masked data; and
outputting a result of the error detection calculation;
wherein a deactivation signal is sent to a read/write circuit of the memory circuit to instruct the read/write circuit not to write the received masking information when the received masking information is delivered to the read/write circuit through the signal path of the memory circuit.

17. The method of claim 16, further comprising, when a masking command signal has been received, activating masking and deactivating reading data or writing data from the memory array.

18. The method of claim 16, further comprising:
storing the masking information, wherein the stored masking information is utilized for masking the data.

19. The method of claim 16, wherein the masking is controlled by a control command.

20. A method of operating a memory circuit, comprising:
providing masking information on an address bus of the memory circuit;
providing data on a data bus of the memory circuit;
delivering the masking information to a read/write circuit of the memory circuit;
delivering a deactivation signal to the read/write circuit to deactivate the read/write circuit in order to prevent the read/write circuit from writing the received masking information;
when a masking command signal is received, activating the masking and deactivating reading data or writing data from the memory array, wherein at least a part of the data are masked utilizing the masking information;
performing an error detection calculation utilizing the masked data and non-masked data; and
outputting a result of the error detection calculation.

21. A system having a memory controller connected via a signal path with a memory circuit, the memory circuit comprising:
a plurality of memory elements;
a read/write circuit connected with the signal path to receive address data for accessing the plurality of memory elements;
a masking circuit; and
an error detection circuit,
wherein the masking circuit is connected with the signal path and the error detection circuit, wherein the error detection circuit is connected with the signal path, wherein the signal path is connected with the masking circuit to deliver masking information to the masking circuit, wherein the masking circuit utilizes the received masking information for masking the data and delivers the masked and non-masked data to the error detection circuit, wherein the error detection circuit generates an error result and delivers the error result via the signal path to the memory controller, and wherein the signal path is disposed for exchanging data, for sending commands and for sending addresses from the memory controller to the memory circuit.

22. An electronic device, comprising:
a signal path for transmitting data;
an input/output interface connected with the signal path;
a masking circuit; and
an error detection circuit,
wherein the masking circuit is connected with the signal path and the error detection circuit, wherein the error detection circuit is connected with the signal path, wherein the signal path is connected with the masking circuit to deliver masking information to the masking circuit, and wherein the masking circuit utilizes the received masking information for masking the data and delivers the masked and non-masked data to the error detection circuit.

23. A method of operating an electronic device, comprising:
providing masking information on a signal path of a memory circuit, wherein the masking information includes one or more bits to mask a data that is provided for error detection calculation;
providing data on the signal path of the memory circuit;
masking at least a part of the data utilizing the masking information;
performing an error detection calculation utilizing the masked data and non-masked data; and
outputting a result of the error detection calculation,
wherein a deactivation signal is sent to a read/write circuit of the memory circuit to instruct the read/write circuit not to write the received masking information when the received masking information is delivered to the read/write circuit through the signal path of the memory circuit.

* * * * *